(12) United States Patent
Paxton et al.

(10) Patent No.: US 7,274,429 B2
(45) Date of Patent: Sep. 25, 2007

(54) INTEGRATED LITHOGRAPHIC FABRICATION CLUSTER

(75) Inventors: Theodore A. Paxton, Chandler, AZ (US); Todd Hiar, Gilbert, AZ (US); Todd Davis, Gilbert, AZ (US)

(73) Assignee: ASML Netherlands B.V., Veldhoven (NL)

( * ) Notice: Subject to any disclaimer, the term of this patent is extended or adjusted under 35 U.S.C. 154(b) by 429 days.

(21) Appl. No.: 10/731,430

(22) Filed: Dec. 10, 2003

(65) Prior Publication Data

US 2005/0128464 A1 Jun. 16, 2005

(51) Int. Cl.
G03B 27/32 (2006.01)
G03B 27/42 (2006.01)
G03D 5/00 (2006.01)
G03C 5/00 (2006.01)

(52) U.S. Cl. .......................... 355/27; 355/53; 355/77; 396/611; 414/935; 430/311

(58) Field of Classification Search .................. 355/53, 355/27; 396/611; 414/935, 936, 937, 938, 414/939, 940, 941; 700/100; 430/30, 311
See application file for complete search history.

(56) References Cited

U.S. PATENT DOCUMENTS

| | | | | |
|---|---|---|---|---|
| 5,651,823 A | * | 7/1997 | Parodi et al. ............... | 118/500 |
| 6,099,598 A | * | 8/2000 | Yokoyama et al. ......... | 29/25.01 |
| 6,466,300 B1 | * | 10/2002 | Deguchi ..................... | 355/27 |
| 6,558,053 B2 | * | 5/2003 | Shigemori et al. .......... | 396/611 |
| 6,926,012 B2 | * | 8/2005 | Biberger et al. ............. | 134/1.3 |
| 6,930,050 B2 | * | 8/2005 | Kim et al. ................... | 438/716 |
| 6,977,014 B1 | * | 12/2005 | Stevens et al. ............. | 118/719 |
| 2004/0005507 A1 | * | 1/2004 | Lakkapragada et al. ...... | 430/30 |
| 2005/0057733 A1 | * | 3/2005 | Owen et al. .................. | 355/30 |
| 2005/0106479 A1 | * | 5/2005 | Geh et al. .................... | 430/30 |

\* cited by examiner

*Primary Examiner*—Alan Mathews
(74) *Attorney, Agent, or Firm*—Pillsbury Winthrop Shaw Pittman LLP

(57) ABSTRACT

An integrated lithographic fabrication cluster system, as presented herein, comprises an exposure apparatus to expose a pattern onto a substrate with an associated exposure controller to control the exposure apparatus and a track apparatus interconnecting a plurality of processing modules with an associated track controller to control the track apparatus. The cluster system also comprises a wafer handling apparatus coupled to the exposure apparatus and track apparatus that is configured to transfer substrates between the processing modules utilized by the exposure apparatus and track apparatus and a wafer handling controller to control the wafer handling apparatus. The cluster system further comprises a cluster controller that communicates control information to at least one of the exposure controller, the track controller, and the wafer handling controller to manage operations of the exposure apparatus, the track apparatus, and the wafer handling apparatus during the lithographic fabrication process.

29 Claims, 4 Drawing Sheets

INTEGRATED LITHOGRAPHIC FABRICATION CLUSTER

BACKGROUND OF THE INVENTION

1. Field of the Invention

The present invention generally relates to integrated lithographic exposure and processing system and methods of lithographic exposure and processing.

2. Description of the Related Art

Among other things, lithographic fabrication systems are used in the manufacture of integrated circuits (ICs). In such cases, a patterning device generates a circuit pattern corresponding to an individual layer of the IC, and this pattern is then imaged or exposed onto a target portion of a substrate (e.g. silicon "wafer") that has been coated with a layer of radiation-sensitive material (e.g. "resist"). Generally, a single wafer substrate will contain a whole network of adjacent target portions that are successively irradiated via a projection system.

To this end, complete lithographic fabrication systems, such as lithographic system 100 depicted in FIG. 1A, typically employ three separate functional entities: (a) a lithographic exposure apparatus 102 that patterns the wafer substrate; (b) a wafer handling apparatus 103 that transports the wafer substrate; and (c) a separate wafer track apparatus 104 that interconnects a host of processing modules $104_{a1}$-$104_{k\#}$, which are configured to perform various processes before and/or after the pattern is exposed onto the wafer substrate.

The term "patterning device" as employed herein should be broadly interpreted to refer to devices that can be used to endow an incoming radiation beam with a patterned cross-section, corresponding to a pattern that is to be created in a target portion of the substrate. The term "light valve" may also be used in this context. Generally, the pattern will correspond to a particular functional layer in a device being created in the target portion, such as an integrated circuit or other device (see below). Examples of such patterning device include:

(a) a mask: the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

(b) a programmable mirror array: an example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic devices. More information on such mirror arrays can be gleaned, for example, from U.S. Pat. Nos. 5,296,891 and U.S. Pat. No. 5,523,193, which are incorporated herein by reference. In the case of a programmable mirror array, the said support structure may be embodied as a frame or table, for example, which may be fixed or movable as required; and (c) a programmable LCD array: an example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning device as set forth above. Also, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

FIG. 1B provides a more detailed illustration of lithographic apparatus 102. As indicated in FIG. 1B, lithographic apparatus 102 comprises:

an illumination system: illuminator IL for providing a projection beam PB of radiation (e.g. UV radiation or other radiation);

a first support structure: (e.g. a mask table, mask holder) MT for supporting patterning devices (e.g. a mask or reticle) MA and connected to first positioning mechanism PM for accurately positioning the patterning device with respect to item PL;

a substrate table: (e.g. a wafer table, wafer holder) WT for holding a wafer substrate (e.g. a resist-coated wafer) W and connected to second positioning mechanism PW for accurately positioning the substrate W with respect to item PL; and a projection system: (e.g. a refractive projection lens) PL for imaging a pattern imparted to the projection beam PB by patterning device MA onto a target portion C (e.g. comprising one or more dies) of substrate W.

The illuminator IL receives a beam of radiation from a radiation source SO. The source SO and lithographic apparatus 102 maybe separate entities, such as when the source SO is an excimer laser. In such cases, source SO is not considered to form part of lithographic apparatus 102 and the radiation beam is passed from the source SO to the illuminator IL with the aid of a beam delivery system BD comprising, for example, suitable directing mirrors and/or a beam expander. In other cases, the source SO may be integral part of apparatus 102, such as when the source SO is a mercury lamp. The source SO and illuminator IL, together with the beam delivery system BD if required, may be referred to as a radiation system.

The illuminator IL may comprise adjusting mechanism AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning mechanism PW and position sensor IF (e.g. an interferometric device), the substrate table WT can be moved accurately, e.g. so as to position different target portions C in the path of the beam PB. Similarly, the first positioning mechanism PM and another position sensor (which is not explicitly depicted in FIG. 1B 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning mechanism PM and PW. However, in the case of a stepper (as opposed to a scanner), the mask table MT may be connected to a short stroke actuator only, or may be fixed. Mask MA and substrate W may be aligned using mask alignment marks M1, M2 and substrate alignment marks P1, P2.

Lithographic apparatus 102 can be used in the following preferred modes:

step mode: the mask table MT and the substrate table WT are kept essentially stationary, while an entire pattern imparted to the projection beam is projected onto a target portion C in one sweep (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed by lithographic apparatus 102.

As noted above, lithographic apparatus 102 also contains an exposure tool controller 102A that communicates with and controls the various mechanisms and features of the apparatus 102 described above in order to process and expose the target portion C of the wafer substrates W in the desired manner.

In current lithographic exposure apparatuses, employing patterning by a mask MA on a mask table MT, a distinction can be made between two different types of machines. In one type of lithographic exposure apparatus—commonly referred to as a wafer stepper—each target portion is irradiated by exposing the entire mask pattern onto the target portion C in one go. In an alternative apparatus—commonly referred to as a step-and-scan apparatus—each target portion C is irradiated by progressively scanning the mask pattern under the projection beam PB in a given reference direction (e.g., "scanning" direction) while synchronously scanning the substrate table WT parallel or anti-parallel to this direction. Because, in general, the projection system will have a magnification factor M (generally <1), the speed V at which the substrate table WT is scanned will be a factor M times that at which the mask table MT is scanned. More information with regard to lithographic devices as here described can be gleaned, for example, from U.S. Pat. No. 6,046,792, incorporated herein by reference.

It is to be noted that the lithographic exposure apparatus may also be of a type having two or more substrate tables (and/or two or more mask tables). In such "multiple stage" devices, the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

Regardless of the lithographic exposure apparatus used, the wafer substrates W may, as noted above, be subjected to a variety of processes before the pattern is exposed onto the wafer substrate. For example, wafer substrate W may be subjected to cleaning, etching, ion implantation (e.g., doping), metallization, oxidation, chemo-mechanical polishing, priming, antireflective coating, resist coating, soft bake processes, and measurement processes. These processes may be completed in individual apparatus or grouped into a common apparatus, such as select ones of the depicted processing modules $104_{a1}$-$104_{k\#}$ of wafer track apparatus 104. For example, wafer track apparatus 104 typically performs priming, antireflective coating, resist coating, soft bake, and measurement processes prior to the exposure process.

The wafer substrates W may also be subjected to a host of post-exposure processes, such as, for example, post exposure bake (PEB), development, hard bake, etching, ion implantation (e.g., doping), metallization, oxidation, chemo-mechanical polishing, cleaning, and measurement processes. Again, these processes may be completed in individual apparatus, or grouped into a common apparatus, such as select ones of the depicted processing modules $104_{a1}$-$104_{k\#}$ of wafer track apparatus 104. For example, wafer track apparatus 104 typically performs post exposure bake (PEB), development, and measurement processes after the exposure processes. If several layers for each wafer substrate W are required, which is usually the case, the entire procedure, or variants thereof, will have to be repeated for each new layer.

As indicated above, these pre- and post-exposure processes are performed by stations or modules designed for their respective purposes. Select ones of processing modules $104_{a1}$-$104_{k\#}$ may be configured as pre-exposure processing modules, which perform pre-exposure processes, and post-exposure processing modules, which perform post-exposure processes.

The wafer substrates W are subjected to processing modules $104_{a1}$-$104_{k\#}$, as well as the lithographic exposure apparatus 102 in a pre-defined sequence. In this arrangement, the wafer substrates W travel along a pre-specified processing path within wafer track apparatus 104 to get serviced by specific processing modules that can be tracked. Wafer track apparatus 104 contains a track controller 104A to control the specific processing path of each wafer substrate.

Wafer track apparatus 104 is coupled to wafer handling apparatus 103. Wafer handling apparatus 103 transports wafer substrates between lithographic exposure apparatus 102 and wafer track apparatus 104. Wafer handling apparatus 103 may include robotic, conveyor, or track mechanisms or combinations therefrom, to transport the wafer substrates between lithographic exposure apparatus 102 and wafer track apparatus 104. Wafer handling apparatus 103 may also include an interface section 103A to provide limited communications between lithographic exposure apparatus 102 and wafer track apparatus 104. Generally, such communications are minimal and are limited to an indication that wafer substrate W is ready to be picked up from the wafer track 104 and delivered to the exposure apparatus, or that a wafer W is ready to be picked up from the exposure apparatus 102 and delivered to wafer track apparatus 104.

Upon receiving the wafer substrate W from the wafer handling apparatus 103, exposure apparatus 102 transports the substrate W through a number of processes modules as specified by the exposure controller 102A of exposure apparatus 102. The wafer track apparatus 104, prior to delivering the substrate W to the wafer handler 103 or upon receiving the substrates from the wafer handler 103, transports the substrates W through various processing modules $104_{a1}$-$104_{k\#}$ specified by the track controller 104A of wafer track apparatus 104.

Needless to say, it is important that the features and profile of the pattern exposed on the target field C of the wafer substrate W layer are replicated as accurately as possible. To this end, manufacturers normally specify key attributes, which can be collectively considered the critical dimension (CD) of the exposed pattern, in order to characterize the features and profile of the pattern and establish a benchmark level of quality and uniformity. The CD metric may include, for example, the gap between features, X and/or Y diameter of holes and/or posts, ellipticity of holes and/or posts, area of feature, feature sidewall angle, width at the top of a feature, width at the middle of a feature, width at the bottom of a feature, and line edge roughness.

There are, however, numerous activities during the lithographic fabrication process that affect the critical dimension uniformity (CDU) and compromise the quality of the exposed pattern. Indeed, many of the very processes that service and treat the substrate wafers along wafer track apparatus 104, such as, for example, the post exposure bake (PEB), chill, and develop processing modules, contribute to variations in the CDU. Such variations may occur across a target field C, across a wafer W, and between wafers W.

Moreover, these variations may be exacerbated by the lack of communications and control between the distinct functional entities of lithographic fabrication lithographic system 100. That is, unwanted variations and non-uniformities may result from the lack of communications, timing, and control as the wafer substrates W travel to and/or from exposure apparatus 102, wafer handling apparatus 103, and wafer track apparatus 104, which houses the processing modules $104_{a1}$-$104_{k\#}$ that treat the substrates W. Ultimately these variations and non-uniformities result in the loss of yield for the lithographic fabrication process, and frequently result in decreased throughput.

SUMMARY OF THE INVENTION

Systems, apparatuses and methods consistent with the principles of the present invention, as embodied and broadly described herein, provide for the improvement of CD uniformity and throughput by an integrated lithographic fabrication cluster system. The fabrication cluster system comprises an exposure apparatus to expose a pattern onto a substrate with an associated exposure controller to control the exposure apparatus and a track apparatus interconnecting a plurality of processing modules with an associated track controller to control the track apparatus. The cluster system also comprises a wafer handling apparatus coupled to the exposure apparatus and track apparatus that is configured to transfer substrates between the processing modules contained within the exposure apparatus and the track apparatus and a wafer handling controller to control the wafer handling apparatus. The cluster system further comprises a cluster controller that communicates control information to at least one of the exposure controller, the track controller, and the wafer handling controller to manage operations of the exposure apparatus, the track apparatus, and the wafer handling apparatus during the lithographic fabrication process.

Although specific reference may be made in this text to the use of the apparatus according to the invention in the manufacture of ICs, it should be explicitly understood that such an apparatus has many other possible applications. For example, it maybe employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion/target field", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm).

BRIEF DESCRIPTION OF THE DRAWINGS

Embodiments of the invention will now be described, by way of example only, with reference to the accompanying schematic drawings in which.

In the figures, corresponding reference symbols indicate corresponding parts.

DETAILED DESCRIPTION

As noted above, many of the processes that treat the wafer substrates, such as, for example, the post-exposure bake (PEB), chill, and develop processes, contribute to variations in CDU that negatively affect the quality and performance of the exposed patterns as well as the speed that these exposed patterns can be generated. And, in particular, these variations may be exacerbated by the lack of communications, timing, and control between lithographic exposure apparatus 102, wafer handling apparatus 103, and wafer track apparatus 104 and its associated processing modules $104_{a1}$-$104_{k\#}$.

For example, increased variations and non-uniformities may result from such processing-related factors as: (a) the particular paths taken by the wafer substrates as they travel through the wafer track apparatus 104; (b) delays in processing through the wafer track apparatus 104; (c) delays between the completion of the patterning by exposure apparatus 102 and the start of the post exposure bake PEB process by wafer track apparatus 104; (d) scheduling anomalies between lithographic exposure apparatus 102 and wafer track apparatus 104; (e) and deviations from nominal process times.

As described in greater detail below, the present invention contemplates an integrated lithographic fabrication cluster that groups together and choreographs the operation of the exposure apparatus, wafer handling apparatus, and that combines some or all of the substrate processing modules that are typically located in the wafer track apparatus. In addition, the cluster incorporates cluster level decision-making functionality as well as communication and feed-forward and feedback control functionality between the various apparatus.

With this configuration, the lithographic fabrication cluster is capable of exploiting the information that has been typically stored within an individual apparatus, such as, for example, wafer track processing data, metrology data, and/or scheduling information, to provide control information that can be communicated to the different apparatus. As such, the lithographic fabrication cluster takes into account processing-related factors to enhance pre- and post-exposure substrate processing and reduce variations and non-uniformities to improve overall CDU performance and throughput and increase productive yields.

Figure 1A:
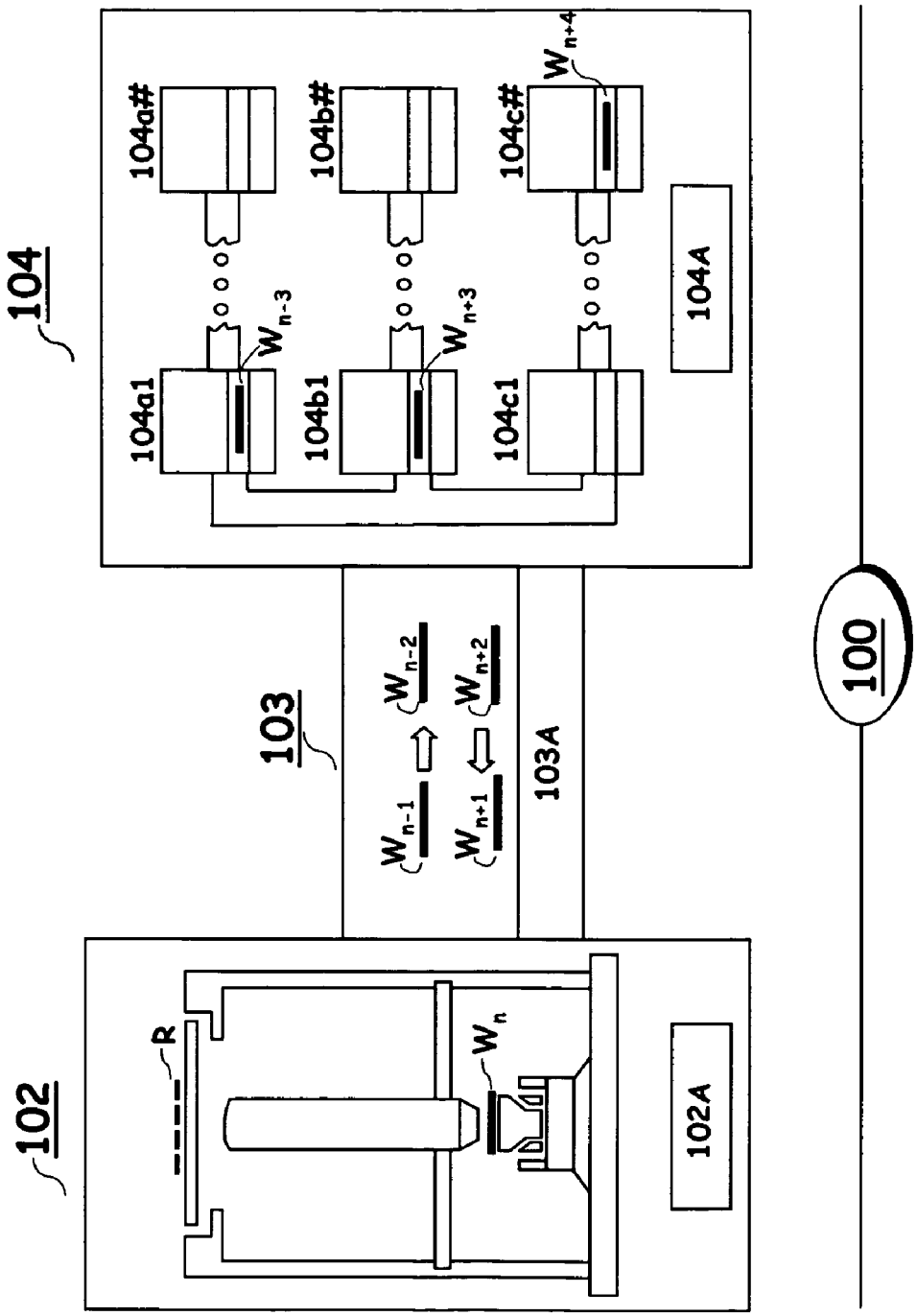
FIG. 1A is a schematic illustration of a current lithographic system including a lithographic projection apparatus, a wafer handling apparatus, and a wafer track apparatus.
Figure 1B:
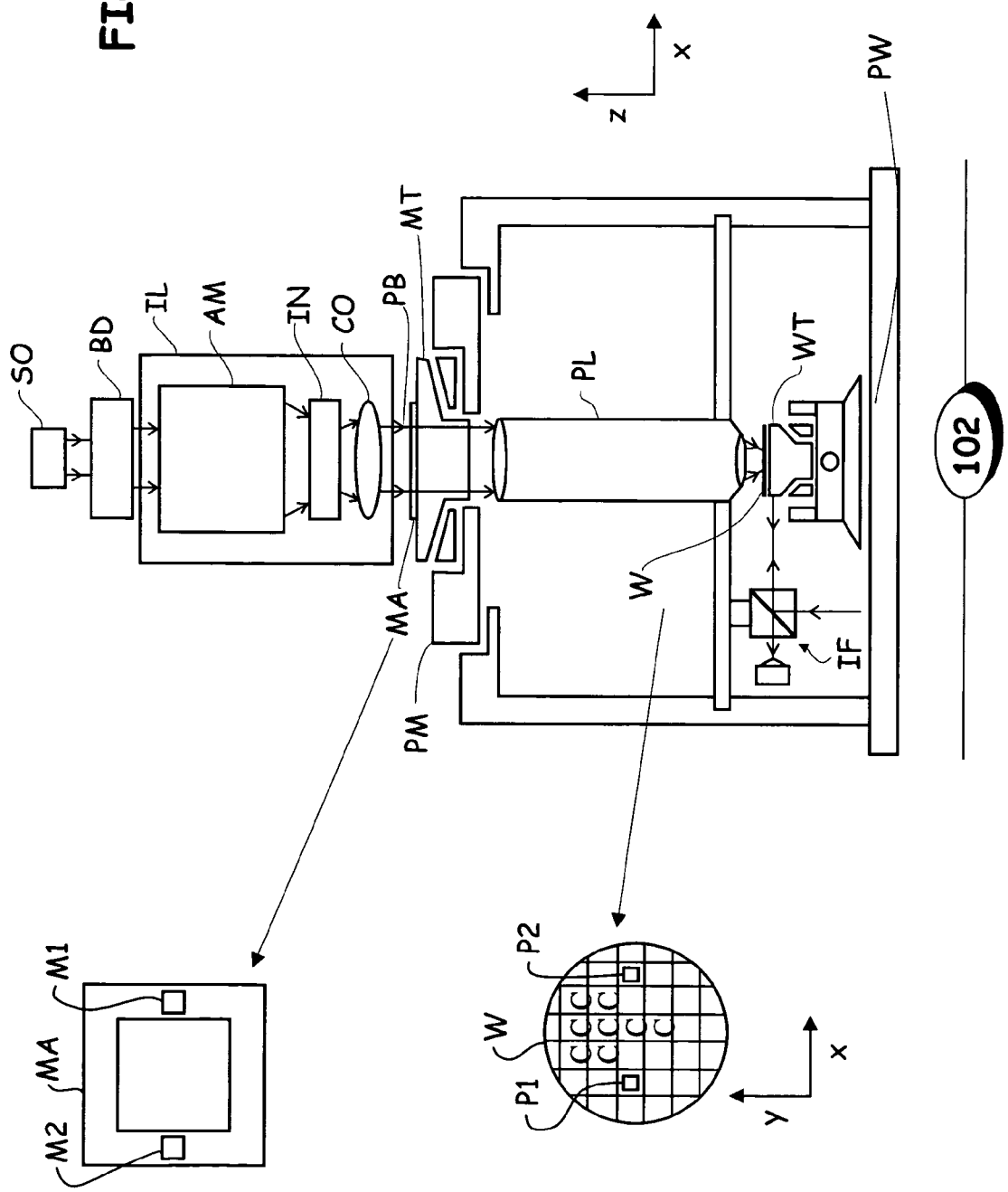
FIG. 1B is a schematic illustration of a lithographic projection apparatus.
Figure 2A:
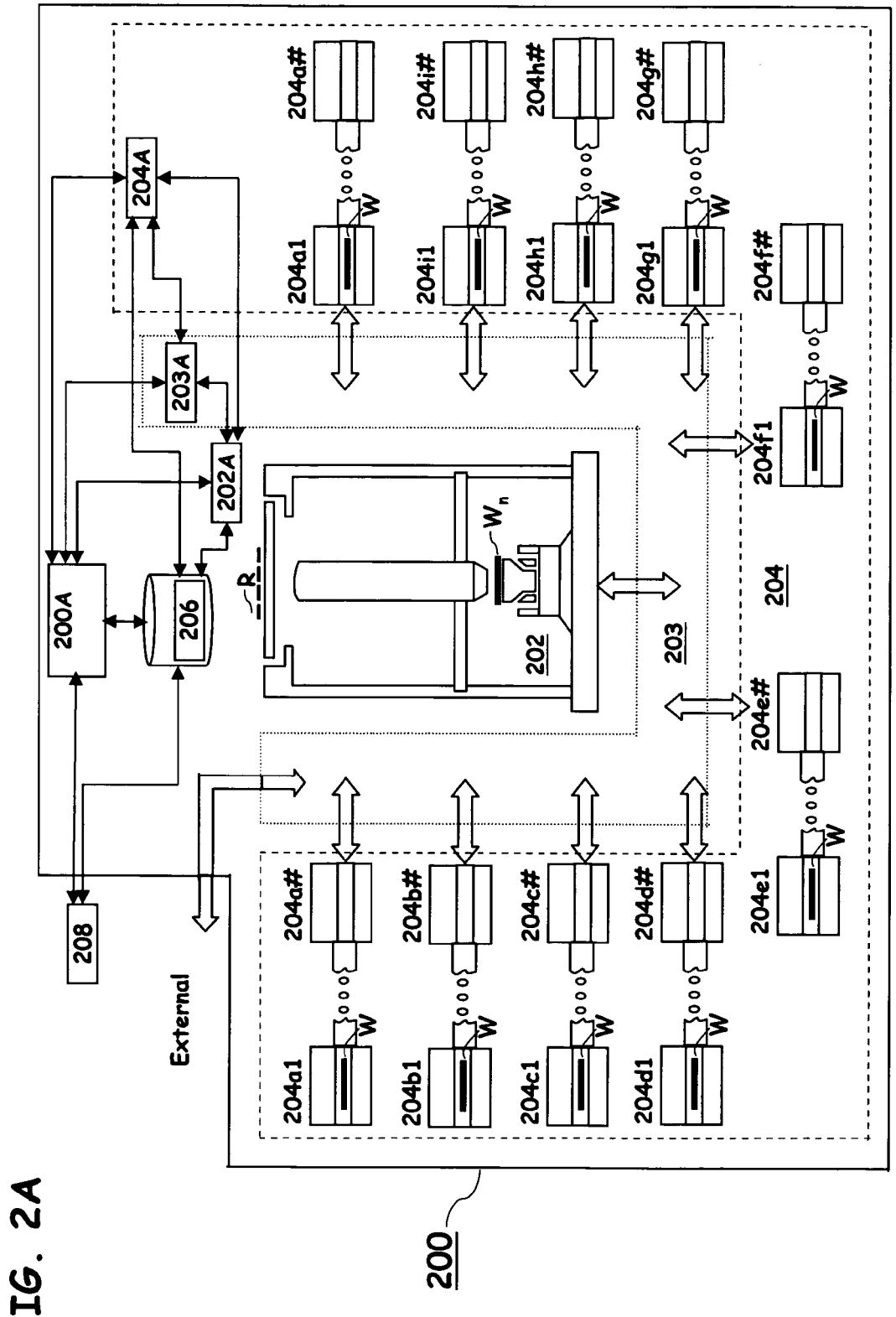
FIG. 2A is a schematic illustration of an integrated lithographic fabrication cluster, in accordance with an embodiment of the present invention.

FIG. 2A schematically depicts integrated lithographic fabrication cluster system 200, constructed and operative in accordance with a particular embodiment of the present invention. As illustrated, system 200 includes cluster controller 200A, lithographic exposure apparatus 202, exposure tool controller 202A, wafer handling apparatus 203, wafer handling controller 203A, wafer track apparatus 204, and wafer track controller 204A.

In one embodiment, cluster controller 200A, lithographic exposure apparatus 202, exposure tool controller 202A, wafer handling apparatus 203, wafer handling controller 203A, wafer track apparatus 204, and wafer track controller 204A are arranged within a common housing structure.

Lithographic exposure apparatus 202 is configured to expose a circuit pattern residing on a reticle or mask onto a target field of a wafer substrate via an irradiating projection beam. As such, lithographic exposure apparatus 202 may include many of the mechanisms and features discussed above.

Lithographic exposure apparatus 202 also includes exposure tool controller 202A that controls, monitors, and communicates with the various mechanisms and features of apparatus 202 to properly process and expose the wafer substrate's target portions C. Moreover, cluster controller 200A provides monitoring and feed-forward/feedback control capabilities to manage various operations performed by the exposure tool apparatus 202, wafer handling apparatus 203, and wafer track apparatus 204.

Exposure tool controller 202A may comprise microprocessing circuitry, application-specific integrated circuitry (ASIC), or similar logic circuitry capable of processing information and instructions, responding to information requests, communicating with linked devices, and executing commands. In addition, exposure tool controller 202A contains a communications interface portion to enable communications and control between various controllers and control elements employed by system 200 and may also include electronic memory and/or storage facilities.

Wafer track apparatus 204 is configured to perform pre-exposure processes including, but not limited to, priming, anti-reflective coating, resist coating, soft bake processes, and measurement processes. Wafer track apparatus 204 is also configured to perform post exposure processes including, but not limited to, post exposure bake (PEB), development, and measurement processes.

In performing these pre- and post-exposure processes, a number of processing stations or modules $204_{a1}$-$204_{kl}$ are incorporated within the wafer track apparatus 204. These processing modules $204_{a1}$-$204_{kl}$ may include Chill Plates, Bake Plates, Coater modules, Developer modules, Priming modules, and metrology modules. Multiple modules of any given type $204_{a1}$-$204_{a\#}$ may be included within wafer track apparatus 204 to increase throughput.

Wafer track apparatus 204 is also configured to interconnect and control processing modules $204_{a1}$-$204_{k\#}$. Select processing modules $204_{a1}$-$204_{k\#}$ may be stacked vertically to accommodate space constraints and/or minimize path lengths between the modules $204_{a1}$-$204_{k\#}$. The track mechanism may be arranged in a multi-level configuration to accommodate the stacked processing modules $204_{a1}$-$204_{k\#}$. In one embodiment, processing modules $204_{a1}$-$204_{k\#}$ comprise priming, antireflective coating, resist coating, soft bake processes, chill stations, post exposure bake (PEB), development, and measurement.

Wafer track apparatus 204 also includes a wafer track controller 204A that controls, monitors, and communicates with the various processing modules, mechanisms and features of wafer track apparatus 204 to properly process and measure the wafer substrates and provided feed-forward/feedback control data.

Wafer track controller 204A may comprise micro-processing circuitry, application-specific integrated circuitry (ASIC), or similar logic circuitry capable of processing information and instructions, responding to information requests, communicating with linked devices, and executing commands. In addition, controller 204A contains a communications interface portion to enable communications and control between various controllers and control elements employed by system 200 and may also include electronic memory and/or storage facilities.

Wafer handling apparatus 203 is configured to transport the wafer substrates W, in a pre-specified order, between processing modules $204_{a1}$-$204_{kl}$ of wafer track apparatus 204 and exposure apparatus 202. Wafer handling apparatus 203 may include robotic, conveyor, or track mechanisms or combinations therefrom to support the delivery and/or retrieval of wafer substrates from processing modules $204_{a1}$-$204_{kl}$. Because wafer track apparatus 204 includes a number of processing modules $204_{a1}$-$204_{k\#}$, all of these modules require the support of wafer handling apparatus 203 to load and unload the wafer substrates W from the individual modules.

Moreover, exposure apparatus 202 also utilizes a number of processing modules that require the support of the wafer handling apparatus 203. These processing modules may include pre-alignment, exposure chuck, discharge chuck, and metrology chuck.

Wafer handling apparatus 203 also includes a wafer handling controller 203A that controls, monitors, and communicates with the various processing modules, mechanisms and features of the cluster, and cluster controller 200A to transport the wafer substrates W to the proper locations in an efficient manner and facilitate the communication of feed-forward/feedback control data.

Wafer handling controller 203A may comprise microprocessing circuitry, application-specific integrated circuitry (ASIC), or similar logic circuitry capable of processing information and instructions, responding to information requests, communicating with linked devices, and executing commands. In addition, controller 203A contains a communications interface portion to enable communications and control between various controllers and control elements employed by system 200 and may also include electronic memory and/or storage facilities.

Cluster controller 200A is configured to communicate with wafer handling controller 203A, wafer track controller 204A, exposure tool controller 202A, substrate processing archive 206, and external information 208 such as user interface, metrology data, and/or a host controller. Cluster controller 200A may comprise micro-processing circuitry, application-specific integrated circuitry (ASIC), or similar logic circuitry capable of processing information and instructions, responding to information requests, communicating with linked devices, and executing commands.

In addition, cluster controller 200A contains a communications interface portion to enable communications and control between various controllers and control elements employed by system 200 and may also include electronic memory and/or storage facilities. Also as indicated above, exposure tool controller 202A provides monitoring and feed-forward/feedback control capabilities to manage various operations performed by the exposure tool apparatus 202, wafer handling apparatus 203, wafer track apparatus 204, substrate processing archive 206, and external information.

Communications between cluster controller 200A, wafer handling controller 203A, wafer track controller 204A, exposure tool controller 202A, substrate processing archive 206, and external information is achieved through a common communications link interconnecting the respective communications interface portion of each of the aforementioned elements. In one embodiment, the communications link comprises a wired link between the elements that accommodates the transmission and reception of electrically-based signals constituting information signals. Other suitable means of establishing communications between the elements, including wireless methods, may also be used.

In an exemplary embodiment, cluster controller 200A functions to monitor and process input control data to effect the processing of the wafer substrates W. Input control data may include: (a) wafer processing history; (b) current and past metrology results; (c) processing steps; (d) processing order; (e) processing times; (f) processing conditions; (g) ambient conditions (e.g., temperature, barometric pressure, etc.); (h) number of requested processing modules; (i) number of available processing modules; (j) processing module locations; (k) number of wafer substrates; (l) over head times; (m) wafer substrate handling times; (n) interrupts, errors, and warnings; (o) exposure time; (p) reticle exchange time; (q) laser fill time; (r) calibrations; (s) user inputs; (t) past processing results; (u) exposure corrections; (v) reticle corrections; and (w) process corrections.

In response to monitoring and processing input control data, cluster controller 200A produces output control data to control the various attributes of wafer substrate W processing. Output control data may provide and control such attributes as: (a) optimized wafer handling timing; (b) optimized wafer handling sequence and path direction; (c) optimized utilization of processing modules; (d) maintain consistent processing times; (e) control the application of process and exposure corrections; and (f) updating of user interface.

Cluster controller 200A is also configured to receive metrology data and wafer substrate W data from substrate processing archive 206, external sources 208, and process such data into substrate-related processing information. The substrate-related processing information may then be exploited to formulate and transmit feed-forward control data in order to manage the various operations performed by exposure apparatus 202, wafer handling apparatus 203, and wafer track apparatus 204.

Feed-forward control data may include: (a) timing data; (b) scheduling data; (c) processing history information; (d) current and past metrology data; (e) processing path data; (f) ambient conditions; and any other information relevant to wafer substrate processing. This information can be used to formulate and implement exposure corrections including, but not limited to, dose corrections, illumination corrections, overlay corrections, leveling corrections, lens element position changes, etc. This information can also be used to formulate and implement processing corrections, such as, for example, processing times, temperatures, spin speeds, air flow, etc.

Processing archive 206, cluster controller 200A, exposure controller 202A, and wafer track controller 204A may be configured to measure and utilize metrology data from internal or external sources 208 as well as other wafer data that relate to CD uniformity and overlay. Metrology data may include: (a) feature size of the entire substrate; (b) size of the individual target fields; (c) thickness of the resist; (d) thickness of the anti-reflective coating; (e) gap between features; (f) X and/or Y diameter of holes and/or posts; (g) ellipticity of holes and/or posts; (h) area of feature; (i) width at the top, middle, and/or bottom of a feature; (j) line edge roughness; (k) feature sidewall angle; and (l) overlay in X and Y directions.

This measurement information may be obtained by a scanning electron microscope (SEM), spectroscopic ellipsometer, reflectometer, electric line width measurement (ELM), focused ion beam (FIB), e-Beam, atomic force microscope (AFM), scatterometer, defect inspection tool, overlay measurement tool, etc. Substrate wafer W data is then forwarded to, and stored in, substrate processing archive 206.

Figure 2C:
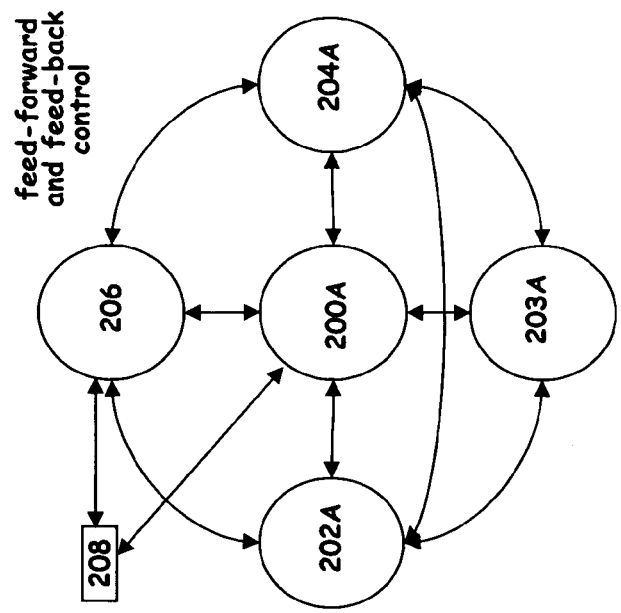
FIG. 2C is a high level flow diagram depicting attributes of an embodiment of the present invention.
Figure 2B:
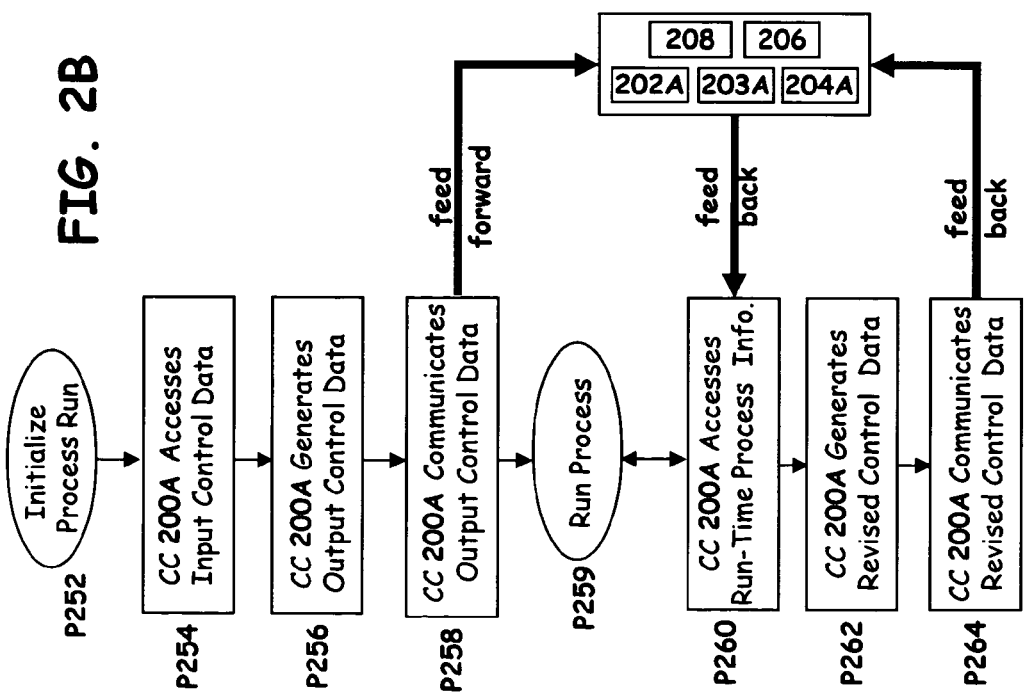
FIG. 2B is a high level flow diagram depicting an embodiment of the present invention.

FIG. 2B illustrates lithographic fabrication process 250, in accordance with an embodiment of the present invention. Lithographic fabrication process 250 provides an exemplary operation of system 200. As indicated in procedure task P252, a particular run of the process is defined and initialized. The definition and initialization of the run includes the specification and initialization of a host of operating parameters including, not limited to, pre-exposure processing, such as, coating spin speeds, bake temperatures, bake timing, etc., exposure information, such as exposure dosages, timing, and sequencing, and post-exposure processing, such as, post-exposure bake temperatures, bake timing, etc.

After the particular run has been defined and initialized, cluster controller 200A, in procedure task P254, accesses input control data from wafer track controller 204A, exposure controller 202A, and wafer handler controller 203A.

As discussed above, input control information identifies attributes that are needed to run the process, such as, for example, identification of the processing modules $204_{a1}$-$204_{kl}$ to be used, the processing times, the wafer handling timing, the wafer handling requirements, the exposure dosage and timing, the wafer history, the process corrections, and other critical processing information. Additionally, input control information may also comprise metrology data and wafer substrate W data from substrate processing archive 206 and/or external sources 208.

As indicated in procedure task P256, based on the input control information, cluster controller 200A then determines and generates output control data to manage the operations of the various cluster apparatuses and components required by the fabrication process in an optimized manner. As discussed above output control data may include, for example, the most efficient processing scheme, process corrections, and scheduling information.

Upon determining the optimized strategy for the cluster, cluster controller 200A, in procedure task P258, communicates the output control data to wafer track controller 204A, exposure controller 202A, and wafer handler controller 203A. This communication is "fed-forward" to controllers 202A, 203A, 204A in order to implement the optimized strategy for the cluster. In procedure task P259, the particular fabrication run is then executed and the substrates are exposed and processed in accordance with the optimized cluster strategy.

To provide further optimization, cluster controller 200A may, as indicated in procedure task P260, also acquire run-time process information as the process is running. Run-time process information is information that indicates attributes of the running process. Run-time process information may include, for example, current processing status, timing, and other processing information from wafer track controller 204A, exposure controller 202A, wafer handler controller 203A, and/or external sources 208. The acquisition of current processing information "feed-back" may be performed on a periodic basis or upon the detection of a pre-specified triggering.

As depicted in procedure task P262, upon acquiring the run-time process information, cluster controller 200A reevaluates cluster performance. If necessary, cluster controller 200A then determines and generates revised output control data to update the operations of the various components of the fabrication process in order to re-optimize cluster performance.

Cluster controller 200A then communicates the revised output control data to wafer track controller 204A, exposure controller 202A, and wafer handler controller 203A, as indicated in procedure task P264. This communication is "fed-back" to controllers 202A, 203A, 204A in order to implement the updated and re-optimized cluster strategy on-the-fly.

The feed-forward and feed-back control implemented by cluster controller 200A can be applied to individual or groups of wafer substrates W, specific or groups of processing modules, processing sequences, exposure methods, reticles, stages, or any individual or grouping of parameters that effect CDU, overlay, or throughput.

FIG. 2C illustrates the feed-forward control capabilities of system 200, in accordance with an embodiment of the present invention. As depicted in FIG. 2C, cluster controller 200A monitors and manages the various operations performed by wafer handling apparatus 203, wafer track apparatus 204, exposure tool apparatus 202, processing archive 206, and monitors external source information 208. Cluster controller 200A may transmit feed-forward control data to wafer handling controller 203A, wafer track controller 204B, exposure tool controller 202A, and processing archive 206. As noted above, feed-forward control information includes control data, such as timing data, scheduling data, processing path data and any other information relevant to wafer substrate processing. This data exchange can also occur directly between processing archive 206, exposure controller 202A, and wafer track controller 204A.

FIG. 2C also illustrates the feedback control capabilities of system 200, in accordance with an embodiment of the present invention. As noted above, cluster controller 200A processes the measured metrology and wafer substrate data stored in substrate processing archive 206 to form substrate-related processing information. The processing information is then formulated to generate feed-forward control data. Thus, by feeding back and factoring the measured metrology and wafer substrate data, system 200 provides the capability to further enhance processing and achieve acceptable CDU levels.

In this manner, integrated lithographic fabrication cluster system 200 coordinates and choreographs the wafer substrate fabrication process and provides cluster level decision-making functionality as well as communications and control functionality between exposure, wafer handling, and wafer processing to enhance pre- and post-exposure substrate processing, improve overall CDU performance and throughput, and increase productive yields.

Whilst specific embodiments of the invention have been described above, it will be appreciated that the invention may be practiced otherwise than as described. The embodiments described above may, instead, be implemented in different embodiments of software, firmware, and hardware in the entities illustrated in the figures. For example, some of the disclosed procedure tasks may be performed by the exposure tool controller or, in the alternative, by a processing device dedicated for such purposes.

As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. An integrated lithographic fabrication cluster system, comprising:
    an exposure apparatus configured to expose a pattern onto a substrate;
    an exposure controller to control said exposure apparatus;
    a track apparatus interconnecting a plurality of processing modules;
    a track controller to control said track apparatus;
    a wafer handling apparatus coupled to said exposure apparatus and said track apparatus and configured to transfer substrates between processing modules utilized by said exposure apparatus and said track apparatus;
    a wafer handling controller to control said wafer handling apparatus, the wafer handling controller in direct communication through distinct communication lines with the exposure controller and the track controller; and a cluster controller, wherein said cluster controller communicates output control information to at least one of said exposure controller, said track controller, and said wafer handling controller to manage operations of said exposure apparatus, said track apparatus, and said wafer handling apparatus.

2. The system of claim 1, wherein said output control information includes at least one of wafer handling timing, wafer handling sequence and path direction, utilization of said processing modules, maintenance of consistent processing times, control application of process and exposure corrections, and updating of a user interface.

3. The system of claim 1, wherein said processing modules include at least one of a bake station, chill station, priming station, resist coating station, anti-reflective coating station, soft bake station, developer station, and measurement station.

4. The system of claim 3, further including an archive that stores metrology information and substrate attribute information provided by said measurement station.

5. The system of claim 4, wherein said metrology and substrate attribute information includes at least one of feature size of said substrate, size of individual target fields of said substrate, thickness of resist on said substrate, thickness of anti-reflective coating on said substrate, size of gap in between features of said substrate, X and Y diameter of holes and posts, ellipticity of holes and posts of said substrate, area of feature on said substrate, width at top, middle, and bottom of feature of said substrate, line edge roughness of said substrate, feature sidewall angle of said substrate and overlay in X and Y directions.

6. The system of claim 4, wherein said control information is based on input control information accessed by said cluster controller from at least one of said exposure controller, said track controller, said wafer handling controller, said external source, and said archive.

7. The system of claim 6, wherein said input control information includes at least one of substrate processing history, current and past metrology results, processing steps, processing order, processing times, processing conditions, ambient conditions, number of requested processing modules, number of available processing modules, processing module locations, number of wafer substrates, over head times, substrate handling times, interrupts, errors, warnings, exposure time, reticle exchange time, laser fill time, calibrations, user inputs, past processing results, exposure corrections, reticle corrections.

8. The system of claim 1, wherein said exposure apparatus, exposure apparatus controller, said track apparatus, said track controller, said wafer handling apparatus, and said wafer handling controller are housed within a common structure.

9. The system of claim 1, further including said cluster controller accessing run-time process data from at least one of said exposure controller, said track controller, and said wafer handling controller during the fabrication process.

10. The system of claim 9, wherein said cluster controller generates updated output control data based on said run-time process data and communicates said updated output control data to at least one of said exposure controller, said track controller, and said wafer handling controller.

11. An integrated lithographic fabrication cluster system, comprising:

an exposure apparatus configured to expose a pattern onto a substrate;

an exposure controller to control said exposure apparatus;

a track apparatus interconnecting a post-exposure baking station and a chill station;

a track controller to control said track apparatus;

a wafer handling apparatus coupled to said exposure apparatus and said track apparatus and configured to transfer substrates between processing modules utilized by said exposure apparatus and said track apparatus;

a wafer handling controller to control said wafer handling apparatus, the wafer handling controller in direct communication through distinct communication lines with the exposure controller and the track controller; and a cluster controller configured to communicate control information to at least one of said exposure controller, said track controller, and said wafer handling controller to manage operations of said exposure apparatus, said track apparatus, and said wafer handling apparatus during the fabrication process, wherein said exposure apparatus, said exposure controller, said track apparatus, said track controller, said wafer handling apparatus, and said wafer handling controller are housed within a common structure.

12. The system of claim 11, wherein said control information is configured to provide optimized operations and includes at least one of wafer handling timing, wafer handling sequence and path direction, utilization of said processing modules, maintenance of consistent processing times, control application of process and exposure corrections, and updating of a user interface.

13. The system of claim 11, wherein said track apparatus also includes a measurement station.

14. The system of claim 13, further including a substrate archive that stores metrology information and substrate attribute information provided by said measurement station.

15. The system of claim 14, wherein said control information is based on input control information accessed by said cluster controller from at least one of said exposure controller, said track controller, said wafer handling controller, and said substrate archive.

16. The system of claim 11, further including said cluster controller accessing run-time process data from at least one of said exposure controller, said track controller, and said wafer handling controller during the fabrication process.

17. The system of claim 16, wherein said cluster controller generates updated output control data based on said run-time process data and communicates said updated output control data to at least one of said exposure controller, said track controller, and said wafer handling controller.

18. The system of claim 11, wherein the track controller, the exposure controller and the wafer handling controller are in direct communication with one another through distinct communication lines.

19. A substrate manufacturing method employing a lithographic fabrication cluster integrating a cluster controller, an exposure apparatus controller configured to control and communicate with an exposure apparatus, a wafer handling apparatus controller configured to control and communicate with a wafer handling apparatus, and a wafer track apparatus controller configured to control and communicate with a wafer track apparatus, said method comprising:

defining a substrate manufacturing process identifying and initializing operating parameters for at least one of said exposure apparatus, said wafer handling apparatus, and said wafer track apparatus;

accessing, by said cluster controller, input control data from at least one of said exposure apparatus controller, said wafer handling apparatus controller, and said wafer track apparatus controller, to determine information required for operations by at least one of said exposure apparatus, said wafer handling apparatus, and said wafer track apparatus, respectively, the wafer handling controller in direct communication through distinct communication lines with the exposure controller and the track controller;

generating, by said cluster controller, optimized output control data configured to optimize operations of at least one of said exposure apparatus, said wafer handling apparatus, and said wafer track apparatus;

communicating, by said cluster controller, said optimized output control data to at least one of said exposure apparatus controller, said wafer handling apparatus controller, and said wafer track apparatus controller; and processing said substrate, by said of at least one of said exposure apparatus, said wafer handling apparatus, and said wafer track apparatus, in accordance with said optimized output control data.

20. The method of claim 19, wherein said processing includes at least one of:

exposing a field on said substrate with a pattern, subjecting said substrate to a post-exposure processing module, said post-exposure processing module including at least one of a bake station, chill station, priming station, resist coating station, anti-reflective coating station, soft bake station, developer station, and measurement station, and transferring said substrate between at least one of said exposure apparatus, said wafer handling apparatus, said wafer track apparatus, and said post-exposure processing module.

21. The method of claim 19, wherein said input control information includes at least one of substrate processing history, current and past metrology results, processing steps, processing order, processing times, processing conditions, ambient conditions, number of requested processing modules, number of available processing modules, processing module locations, number of wafer substrates, over head times, substrate handling times, interrupts, errors, warnings, exposure time, reticle exchange time, laser fill time, calibrations, user inputs, past processing results, exposure corrections, reticle corrections.

22. The method of claim 19, wherein said cluster controller further accesses run-time processing data, to determine operational information of at least one of said exposure apparatus, said wafer handling apparatus, and said wafer track apparatus during said processing of said substrate.

23. The method of claim 22, wherein said cluster controller evaluates said run-time processing data to determine whether to revise said optimized output control data.

24. The method of claim 23, wherein said cluster controller communicates said revised optimized output control data to at least one of said exposure controller, said track controller, and said wafer handling controller.

25. The method of claim 19, wherein said optimized output control data includes at least one of wafer handling timing, wafer handling sequence and path direction, utilization of said processing modules, maintenance of consistent processing times, control application of process and exposure corrections, and updating of a user interface.

26. The method of claim 19, further including an archive that communicates with said cluster controller and stores metrology information and substrate attribute information provided by a measurement station.

27. The method of claim 26, wherein said metrology and substrate attribute information includes at least one of feature size of said substrate, size of individual target fields of said substrate, thickness of resist on said substrate, thickness of anti-reflective coating on said substrate, size of gap in between features of said substrate, X and Y diameter of holes and posts, ellipticity of holes and posts of said substrate, area of feature on said substrate, width at top, middle, and bottom of feature of said substrate, line edge roughness of said substrate, feature sidewall angle of said substrate and overlay in X and Y directions.

28. The method of claim 19, further including disposing said exposure apparatus, said exposure apparatus controller, said track apparatus, said track controller, said wafer handling apparatus, and said wafer handling controller within a common structure.

29. The method of claim 19, wherein the track controller, the exposure controller and the wafer handling controller are in direct communication with one another through distinct communication lines.

* * * * *